United States Patent
Krueger et al.

(10) Patent No.: US 7,808,251 B2
(45) Date of Patent: Oct. 5, 2010

(54) METHOD AND APPARATUS FOR DETERMINING AN INTERFERING FIELD STRENGTH IN AN AIRCRAFT

(75) Inventors: Heinz-Wolfgang Krueger, Buchholz/nordheide (DE); Ralf Marcordes, Minden (DE)

(73) Assignee: Airbus Deutschland GmbH (DE)

( * ) Notice: Subject to any disclaimer, the term of this patent is extended or adjusted under 35 U.S.C. 154(b) by 310 days.

(21) Appl. No.: 11/970,496

(22) Filed: Jan. 7, 2008

(65) Prior Publication Data

US 2009/0167321 A1    Jul. 2, 2009

Related U.S. Application Data

(63) Continuation of application No. PCT/EP2006/064009, filed on Jul. 7, 2006.

(30) Foreign Application Priority Data

Jul. 7, 2005    (DE) .................. 10 2005 032 141

(51) Int. Cl.
 *G01R 27/28* (2006.01)
(52) U.S. Cl. .................. 324/612; 324/628; 324/681
(58) Field of Classification Search .................. 324/628
 See application file for complete search history.

(56) References Cited

U.S. PATENT DOCUMENTS 4,224,607 A * 9/1980 Poirier et al. ............... 340/552
4,835,604 A * 5/1989 Kondo et al. .................. 725/76
4,987,394 A * 1/1991 Harman et al. ............... 333/237
5,510,766 A * 4/1996 Harman et al. ............... 340/552
5,670,742 A   9/1997 Jones
6,252,507 B1 * 6/2001 Gagnon ....................... 340/552
6,580,915 B1 * 6/2003 Kroll ......................... 455/456.3
6,990,338 B2 * 1/2006 Miller et al. ................. 455/431
7,310,573 B2 * 12/2007 Stickling ..................... 701/3
7,522,045 B2 * 4/2009 Cutler et al. ................. 340/565
2004/0114888 A1 * 6/2004 Rich et al. ................... 385/101

FOREIGN PATENT DOCUMENTS

DE    197 04 763 A1    8/1998
EP    0 277 014 A2    8/1988

* cited by examiner

*Primary Examiner*—Thomas Valone
(74) *Attorney, Agent, or Firm*—Perman & Green LLP

(57) ABSTRACT

The disclosed embodiments relates to a method and an apparatus for determining the interfering field strength in an aircraft and the impairment of an electric system in the aircraft including cables between the outer shell and the interior panelling of the fuselage for transmitting signals within the aircraft. In order to enable direct and reliable determination of interfering field strength in an aircraft and assessment of the electromagnetic vulnerability of the communications system in the aircraft depending on the results of the determination, either a predetermined transmission signal is fed in at least one leaky line between outer shell and panelling of the fuselage and the reception signal that is irradiated by the leaky line is received with a receiver, or a predetermined transmission signal is transmitted with a transmitter and the reception signal is extracted from the leaky line. Subsequently the amplitudes of the transmission and the reception signals are compared with each other.

11 Claims, 2 Drawing Sheets

METHOD AND APPARATUS FOR DETERMINING AN INTERFERING FIELD STRENGTH IN AN AIRCRAFT

CROSS-REFERENCE TO RELATED APPLICATIONS

This application is a continuation of and claims the benefit of International Application No. PCT/EP2006/064009, International Filing Date, 2006 Jul. 7, which designated the United States of America, and which international application was published under PCT Article 21(2) as WO Publication No. WO 2007/006749 A1.

BACKGROUND

1. Field

The disclosed embodiments relate to the protection of electronic communication systems and of the electronic units being connected through such communication system, respectively, in an aircraft against electromagnetic irradiation. In particular the disclosed embodiments relate to a method and an apparatus for determining the interfering field strength according to the preamble portion of claims 1 and 4, respectively.

2. Brief Description of Related Developments

The cabling of the communication system in vehicles and especially in aircrafts is usually disposed between the outer shell and the interior panelling of the vehicle. In this context the term cabling shall encompass all electrically conducting cables for transmitting electrical signals and for power supply. The outer shell of aircrafts is usually made up of metal and thus provides a good screening against irradiations to the outside. Correspondingly there is also only little induction in the cabling from outside.

For protecting the aircraft cabling against electromagnetic interferences from inside the aircraft e.g. by electromagnetic fields from passenger mobile phones many of the cables are shielded; single cables as well as entire cable bundles are enveloped in braided metal shields. Moreover cables are often twisted.

The screening of the cables however considerably contributes to the overall weight of the aircraft. By omitting the shielding a weight reduction of up to ca. 150 kg is achievable. On the other hand, in the above prior art this would cause a deterioration of the interference protection and incur detrimental effects on the performance of the electronic aircraft system by electromagnetic interferences, i.e. the performance of certain electronic components and of the communication system might be adversely affected.

SUMMARY

The aspects of the disclosed embodiments provide an apparatus and a method for direct and reliable determination of interfering field strength in an aircraft and to reduce the electromagnetic vulnerability of the aircraft communication system depending on the result of the determination.

The aspects of the disclosed embodiments determine interfering field strength in an aircraft.

The disclosed embodiments are based on disposing a leaky line as a radiator between the outer shell and the interior panelling and monitoring its irradiation and reception characteristics. Preferably the leaky line is disposed in the vicinity of critical spots and is arranged substantially in parallel to existing cables in the aircraft in order to simulate the irradiation and reception characteristics of the existing cables. In order to monitor the irradiation of the existing cables a signal is fed in the leaky line from an auxiliary transmitter. The signal that is irradiated from the leaky line is captured inside the aircraft by a mobile receiver. For examination of the reception characteristics of the existing cables a test signal is irradiated from an auxiliary irradiation source either inside or outside the aircraft and the signal strength of the test signal being received by the leaky line is determined. By comparison of the irradiated field strength and the received field strength the attenuation by components installed in the aircraft may be determined, in particular the attenuation that is achieved by the interior panelling. Hence, there is provided an apparatus by the disclosed embodiments that allows a reliable and accurate assessment of the vulnerability of the electric system in an aircraft and that has definite and stable electrical characteristics.

According to the disclosed embodiments the method for determining the interfering field strength in an aircraft and impairment of an electric system in the aircraft comprising cables between an outer shell and a panelling of the aircraft fuselage for transmitting signals in the aircraft, comprises the steps of:

either feeding a predetermined transmission signal in at least one leaky line between outer shell and panelling of the fuselage and receiving with a receiver a reception signal that is irradiated by the leaky line, or transmitting a predetermined transmission signal with a transmitter and extracting a reception signal from the leaky line and comparing the amplitudes of the transmission and the reception signals.

According to the disclosed embodiments preferably also the amplitudes of the data with and without interior panelling are compared to each other. This is accomplished either by calculating the difference or by calculating the ratio of the respective data.

In a preferred embodiment the amplitude of the transmission and/or reception signals is calibrated in V/m. Thus the field strength may be represented with reference to an absolute threshold value, above which impairments of the electric system in the aircraft may occur. In other words, if the interior panelling is not capable of reducing the field strength below such predetermined value it is either to be replaced or endangered components of the electric system in the aircraft are to be switched off.

Correspondingly, the apparatus according to the disclosed embodiments for determining the interfering field strength in an aircraft and the impairment of an electric system in the aircraft is characterized by at least one leaky line between outer shell and panelling of the fuselage, at least one transmitter for transmitting a predetermined transmission signal and at least one receiver for receiving an irradiation signal, wherein either the transmitter is coupled to the leaky line for feeding the predetermined transmission signal in the leaky line, or the receiver is coupled to the leaky line for extracting the reception signal from the leaky line and a comparator for comparing the amplitudes of the transmission and reception signals.

Preferably one or—if applicable—multiple of the following features are embodied by the electrical system according to the disclosed embodiments:

said comparator is a two-port network analyzer;

the antenna of said receiver comprises a leaky line antenna;

said receiver comprises a mobile antenna the geometrical dimensions of which are small in comparison to the longitudinal dimension of the leaky line;

said antenna is a broadband antenna of about 25 cm×25 cm size for frequencies between some MHz and some GHz;

an assemblage of leaky lines is disposed in the aircraft between outer shell and panelling in parallel to the aircraft axis;

the leaky lines of the assemblage are uniformly distributed over the circumference of the fuselage and pairs of adjacent leaky lines mutually have an identical distance from each other;

transverse lines are disposed in addition to the assemblage of leaky lines in parallel to the aircraft axis so as to subdivide the fuselage into a grid of longitude and latitude coordinates;

the individual leaky lines are each coupled to an individual transmitter or receiver.

One advantage of the disclosed embodiments is to overcome the main obstacles related to the arrangement of appropriate antennas in the aircraft for monitoring the electromagnetic screening of the panelling installation. A better and more efficient use is made of the panels forming the interior panelling. Maintenance requiring removal, installation or exchange of the panelling is simplified and more reasonable.

BRIEF DESCRIPTION OF THE DRAWINGS

Other features and advantages of the disclosed embodiments will become more apparent from the following description of preferred embodiments, by way of example only, with reference being made to the accompanying drawing.

The drawing is not to scale. Identical reference numerals are assigned to equal or equivalent elements in the drawing.

DETAILED DESCRIPTION OF THE DRAWINGS

Figure 1:
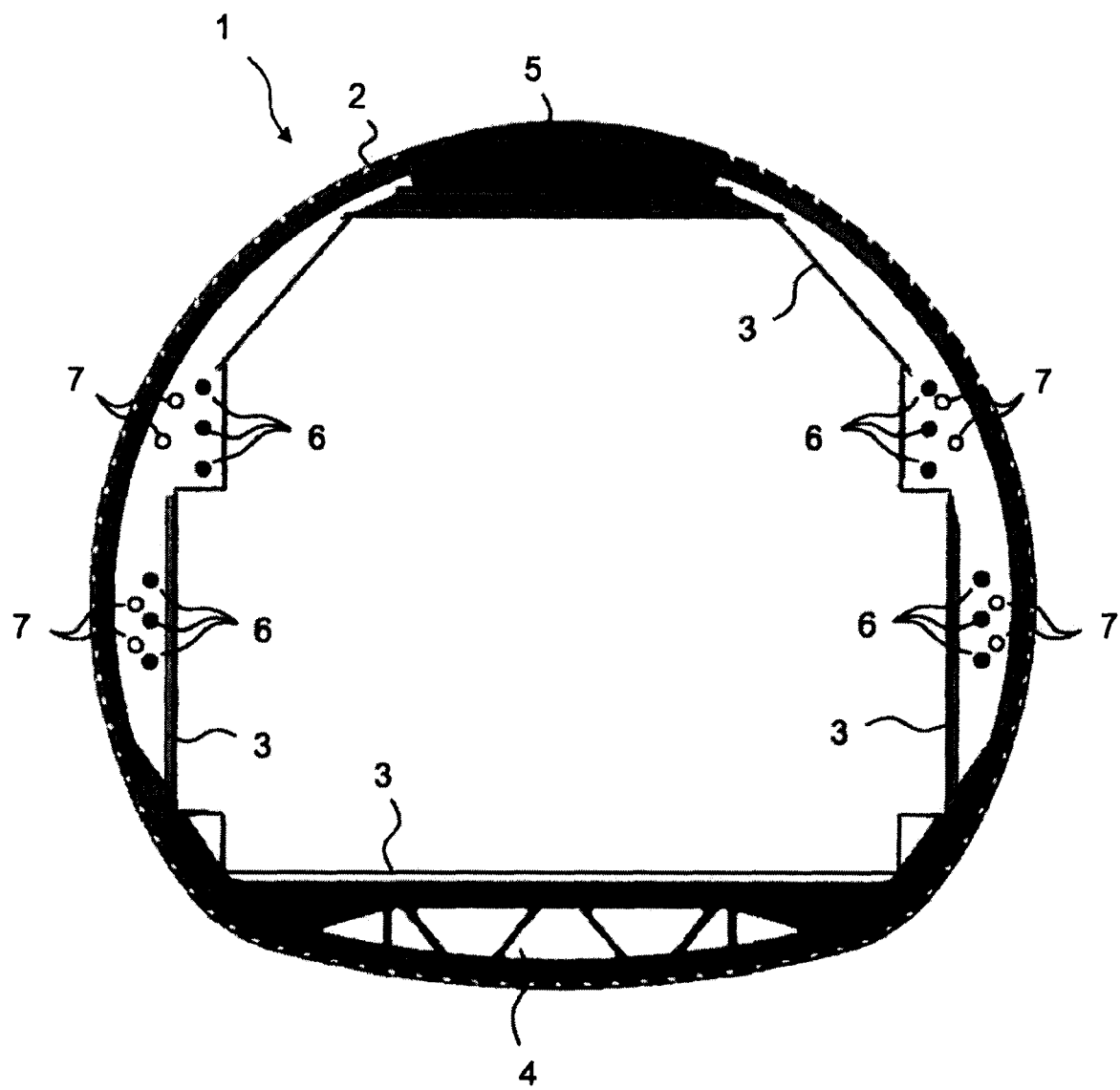
FIG. 1 shows the cross section of an aircraft fuselage embodying the apparatus according to the disclosed embodiments.

In FIG. 1 the cross section of an aircraft fuselage 1 is depicted in a plane that is perpendicular to the longitudinal axis of the aircraft. The fuselage 1 comprises an outer shell 2. There is a cargo compartment provided inside the fuselage for goods and a passenger cabin for flight passengers. The cargo compartment and the passenger cabin, respectively, are provided with an interior panelling or an interior casing 3 consisting e.g. of multiple individual panels that are made of glass fibre reinforced plastic each. Thus the interior is protected against excessive temperature variations, dirtying, acoustic noise and condensation.

Depending on the kind of aircraft the floor of the cabin and cargo compartment, respectively, may be fortified by a support rail system 4 beneath the floor. The interior does not usually extent upwards to the outer shell 2 of the aircraft, but ends up before in a roof structure 5 that accommodates supply lines (not shown) for supply services between head and tail of the aircraft.

In the space between outer shell 2 of the aircraft and the panelling 3 there are provided electric cables 6 for communication services inside the aircraft. On one hand these cables 6 may be used for transmitting control signals from the cockpit to the wings and the vertical rudder, respectively, and for the exchange of information between cockpit crew and personnel in the cargo compartment. On the other hand there are cables provided for the power supply of components by power generators in the aircraft.

Electromagnetic radiation penetrating into the interior of the aircraft may cause parasitic noise in the electric cables 6 and may thus affect communication and power supply, respectively, inside the aircraft or may even cause interruption of the transmission of important data.

If the shielding of cables 6 is removed for weight reduction and the entire panelling 3 of the aircraft is coated with a conductive layer, it will be necessary upon maintenance of the panelling 3 to ensure a full restoration of the screening by the panelling and compliance with the requirements of electromagnetic attenuation after the maintenance work has been completed. To that order an antenna is arranged between panelling 3 and outer shell 2 of the aircraft. The antenna comprises a cable acting as a transmission and/or a reception antenna. Preferably the cable is disposed adjacent to those supply cables that are particularly interference-prone. Preferably the antenna is a leaky line. Basically such leaky line is a coax-cable. It comprises an insulated core wire that is enveloped by an electric shielding or by a tube made of copper. With the usual coax-cables the shielding is so fine-meshed that almost no RF-radiation will penetrate it. Consequently the RF-signal to be transmitted is not attenuated by irradiation leaking through the shielding. In addition the shielding prevents penetration of external RF-fields into the cable. Coax-cables are known for their largely stable and frequency-independent characteristics. With leaky lines however the shielding is deliberately made permeable to a certain extent for RF-radiation. The cable largely maintains its excellent electrical characteristics, yet a predetermined part of the transmitted RF-signal is irradiated through the shielding and emanates to the outside. The line equals a distributed transmitting antenna therefore. On the other hand also external fields may penetrate into the cable now. Therefore the cable also equals a distributed reception antenna. Depending on the realization of the shielding the field portion that penetrates the shielding is well determined.

Preferably the leaky line is part of the permanent installation like an ordinary transmission cable and it is therefore available for tests at any time e.g. after maintenance of the panelling.

The test procedure will be explained below with reference being made to FIG. 2.

Figure 2:
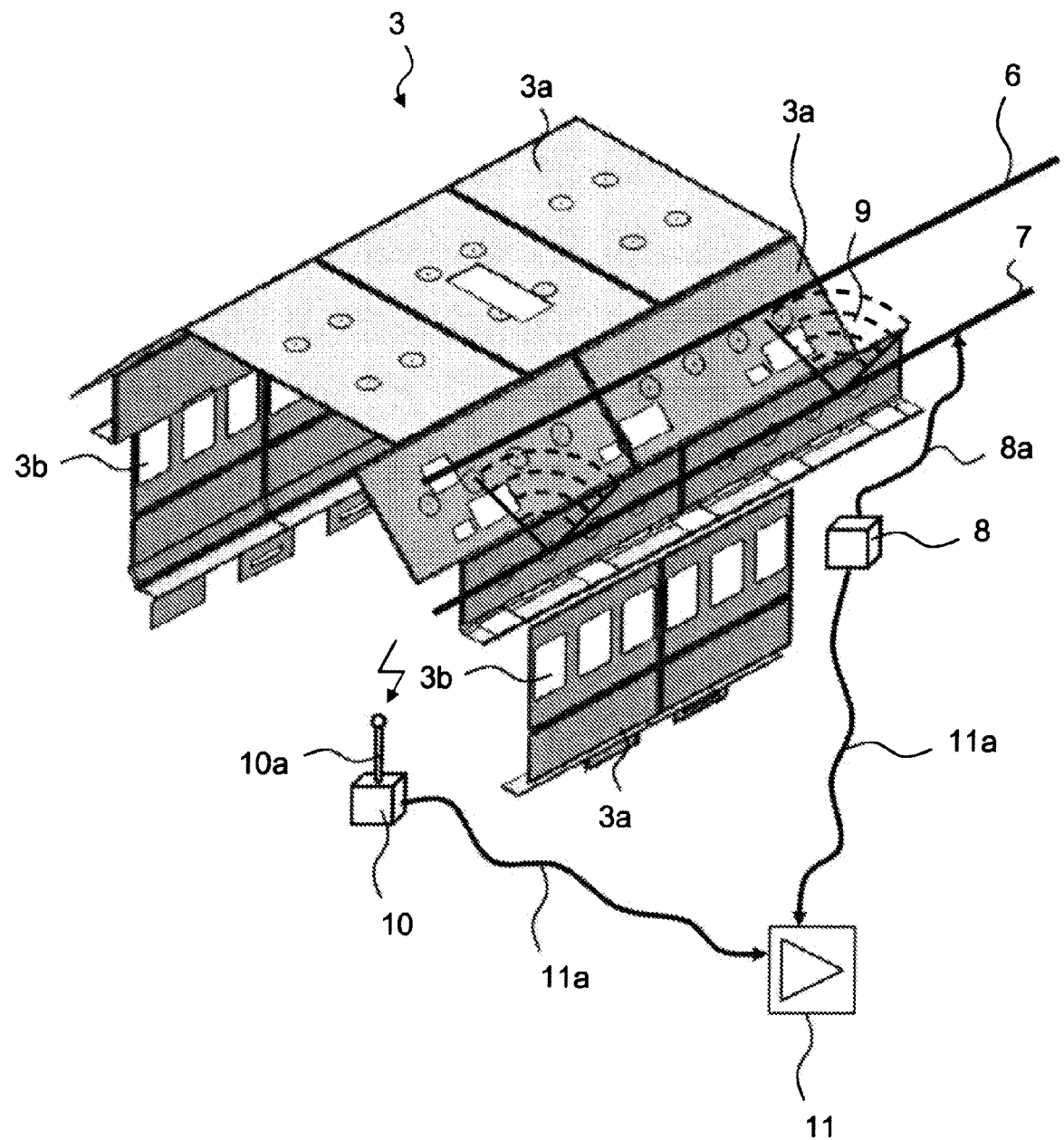
FIG. 2 shows a partial perspective view of the interior panelling of the fuselage embodying the apparatus according to the disclosed embodiments.

In FIG. 2 a perspective view is shown of the panelling (protective lining 3) of the cargo compartment and the cabin, respectively. As apparent from FIG. 2 said panelling 3 consists of a plurality of individual panels 3a. Some of the individual panels 3a may be disposed adjacent to windows and hatches of the aircraft and have openings 3b that correspond to the respective windows and hatches in the outer shell of the aircraft. For minimization of the interfering field strength in cables of an aircraft and thus of induction in the electric systems in the aircraft comprising communication cables 6 for transmission of signals inside the aircraft between outer shell 2 and panelling 3 of the fuselage 1, the panelling of the cargo compartment and cabin is provided with an electrically conductive coating as a screening which in the prior art is attained by individual cable shielding. Thus impairments of the communication over the aircraft cabling by electromagnetic fields that emanate from the interior of the aircraft, e.g. being irradiated from passenger mobile phones or entering through the open cargo hatchway, are avoided.

The panelling 3 consists of a plurality of individual panels. Each of the individual panels is coated with a conductive layer and multiple of them are joined together then to one entity. Consequently certain requirements as to the electric resistance of the panel coating as well as to the electric connection of the panels are to be fulfilled in order to provide a Faraday-cage as desired. To that order either a large number of so called contact elements may be provided or the coating is extended beyond the junction between adjacent panels. The contact elements comprise pads on one of the panels where a wire joint or another electric connection is bonded and which in turn ends at a respective pad on the adjacent panel. The electric resistance between two coated panels is minimized by such wire link between two coated panels. As an alternative rivets or similar mechanical fastenings that are conductive and that penetrate two adjacent panels can be used as contact elements so as to establish an electrical connection between adjacent panels.

The openings and windows 3b in the panels 3 are closed by inserts (not shown) being coated like the rest of the respective panel. Thus electromagnetic radiation is prevented from freely penetrating into or emanating from the aircraft through openings and windows 3b in the panels.

As a part of quality control during production of the aircraft and also later during maintenance of the aircraft it is required to preserve the desired screening effect, even after any kind of manipulation of the coated panel at a later time. To that order the electric resistance of the connection between two adjacent panels has to be determined. However, this is not feasible in praxis, even if single contact elements were provided between panels since the number of contact elements is much too great. Yet such determination may be performed by detecting the attenuation of an electromagnetic wave that travels through the panelling. For this an appropriate antenna structure is required for reproducible transmission of electromagnetic waves through the completed panelling and determination of the effected attenuation.

According to the disclosed embodiments this is achieved by detecting the attenuation of electromagnetic waves through coated panels in a single detection step. For this purpose the panelling is disposed between transmitting and receiving antennas and the attenuation is determined with an appropriate detector, e.g. a two-port network analyzer. The difference of the detected signals with and without panelling determines the screening efficiency of the panelling 3.

The transmitting and receiving antenna is a leaky line 7 that is part of the permanent installation in the aircraft according to the disclosed embodiments. Preferably it is disposed in the vicinity of the actual communication lines 6 of which only one is shown in FIG. 2 for sake of clarity. More preferably the leaky line 7 is arranged in parallel to the actual communication lines 6. The leaky line 7 is not a point-like radiation source but rather generates a well adjustable electromagnetic field along its length that additionally may be uniformly distributed if necessary. This is indicated in FIG. 2 by two symbolic irradiation lobes 9. With the leaky line 7 therefore detection of the attenuation of electromagnetic radiation by a considerable part of the panelling 3 is rendered feasible.

Instead of a uniformly distributed electromagnetic field the path of the leaky line can also be adapted to the requirements of the area that is actually covered in the test procedure. In addition, if desired more than only one leaky line 7 may be installed. Anyhow the leaky line 7 is disposed behind the tested panelling 3, i.e. the panelling 3 is located between transmitting and receiving antennas which may be located inside or outside the aircraft.

In the embodiment in FIG. 2 the leaky line 7 is fed through a transmitter 8 which is coupled to the leaky line 7 through a transmitter antenna feed line 8a. The leaky line 7 is irradiating, and the irradiated signal is detected by a receiver via its reception antenna 10a. Thereafter both amplitudes of the transmission and reception signals are analysed and are compared in a comparator 11 which is coupled via comparator feed lines 11a to the transmitter 8 and the receiver 10, respectively. The result is displayed to the user on input/output devices (not shown). The user may thus decide whether or not the attenuation of the panelling 3 is still acceptable after manipulation or maintenance of the panelling 3.

In addition it is possible to compare the detected values with reference values that are previously stored without panelling 3 by simply comparing transmission and reception signals. In this way a compare value is obtained which e.g. refers to an absolute scale instead of a compare value referring to a relative scale only. In a preferred embodiment such calibration is performed by disposing a calibrated irradiation source outside the aircraft in a predetermined distance and detecting the field strength inside the fuselage with a mobile receiver 10. Thereafter the external irradiation source is switched off and the leaky line is fed with a transmission signal by a transmitter 10 which signal is changed until the receiver 10 detects the same reception amplitude as with the external irradiation source being active. Such calibration may be repeated several times with changing positions of the receiver 10 in the fuselage. The detected data are stored (along with the positions) as a calibration in absolute values (whereas otherwise only relative statements are feasible).

Preferably the comparator 11 is a two-port network analyzer. The virtual process of comparison may comprise calculation of a difference value or of a ratio of the detection data. The antenna 10a of the receiver 10 may be a leaky line (not shown) that, as to orientation and extension, substantially corresponds to the leaky line 7 as part of the permanent installation. In particular the leaky line may be a coax cable that is arranged in a similar way as the leaky line 7 as part of the permanent installation.

In a preferred embodiment of the disclosed embodiments (not shown) an (external) computer is used instead of a two-port network analyzer to analyze the detected data. In this case an extended analysis of the detected data is feasible that goes beyond a mere calculation of difference values and ratios. A skilled person will decide on whether to employ a two-port network analyzer or an external computer according to the existence or absence of devices and their potential or real availability in the aircraft.

As an alternative the antenna 10a of the receiver 10 is a mobile antenna. With such antenna of the mobile receiver the interior of the aircraft may be selectively searched for leaks in the panelling 3. The mobile antenna has the advantage that its dimensions are small in comparison to the longitudinal dimension of the leaky line 7. For example the mobile antenna size is about 25 cm×25 cm and it is thus particularly well suited for frequencies between some MHz and some GHz.

From the above description it should be clear for a skilled person that transmitter and receiver may be exchanged. Instead of the transmission signal being fed in the leaky line 7 between outer shell 2 and panelling 7 of the fuselage 1 and receiving the receiver signal being irradiated from the leaky line 7 by the receiver 10 the transmission signal may be irradiated by the transmitter 8 via a dielectric rod antenna or similar means and the reception signal may be extracted from the leaky line 7 by the receiver 10 which is coupled to the leaky line 7 by an appropriate line.

In case of determining the screening of the interior of the aircraft by the panelling 3 the reception antenna 10a is preferably disposed substantially at the longitudinal central axis of the cabin. The reception antenna may be realized as a leaky line as well as a mobile antenna, alternatively. Its geometric dimensions are small in comparison to the longitudinal dimension of the leaky line 7 and it is a broadband monopole antenna of 25 cm×25 cm, optimized for frequencies between some MHz and some GHz.

In case of a movement of a mobile transceiver 10, be it as a mobile receiver or as a mobile transmitter, the signal that is detected or irradiated by the leaky line becomes weaker or stronger depending on the position of a leak. Thus a localization of the position of a leak becomes feasible. In order to improve such localization, instead of merely one leaky line an assemblage of leaky lines is permanently installed in the aircraft in parallel to the aircraft axis between outer shell and panelling. Preferably the leaky lines are uniformly distributed over the circumference of the fuselage, i.e. pairs of lines have mutually the same distance from each other. By employing multiple leaky lines that are arranged as explained above, it is possible to localize the azimuth of a leak starting from the longitudinal fuselage axis. To this order all individual leaky lines of the leaky line assemblage are fed by a single transmitter or receiver. With more than one leaky line however these are preferably employed as receiver antennas. In this way the reception signal can be assigned to a specific leaky line and the leak can thus be accurately localized.

In order to localize a leak also on the longitudinal fuselage axis there are, in still another preferred embodiment (not shown), transverse lines provided, i.e. in addition to the assemblage of leaky lines in parallel to the fuselage axis, so as to divide the fuselage into an array of latitude and longitude values. The individual leaky lines are all fed from their own transmitter or receiver. However, with multiple leaky lines these are preferably used as reception antennas instead of transmitting antennas. With such an arrangement the reception signal may then be assigned to a single longitudinal leaky line and a single transversal leaky line, thus identifying the position of a leak even more accurately than with the embodiment above.

Hence, basically the disclosed embodiments are not limited to the assignment of the leaky line as a transmitting line, instead the leaky line may also be used as a reception antenna and a signal that is to be detected is irradiated by a mobile transmitter and is captured then by the leaky line. In connection with the two embodiments mentioned above the mobile device 10 is a mobile transmitter and the antenna of the mobile transmitter 10a is a simple monopole antenna, a (broadband) dipole antenna or a multipole antenna of a higher order. It can however be a strip radiator, a horn radiator or a general microwave radiator so as to selectively "illuminate" the interior with its radiation lobe.

The leaky line antenna and the leaky line antenna system, respectively, between outer shell and interior panelling allow the continual monitoring of the attenuated interfering field strength including its frequency and recording the data in a flight data recorder and a maintenance computer, respectively, for their temporally and locally separate examination. In addition the interfering field strength may be displayed on a monitor in the Load Master Control Station (not shown) and be watched continually during the flight and on ground.

From the above description it should be clear for a person skilled in this field that the disclosed embodiments are not limited to a particular form of panels in the aircraft interior but that the screening efficiency may also be determined with generally flat panels or with shielded compartments and spaces. Moreover it should be clear from the above description of preferred embodiments that the method is not limited to aircrafts but is also applicable to other vehicles or interiors that are to be examined.

REFERENCE NUMERALS 1 fuselage
2 outer aircraft shell
3 panelling, 3a panel, 3b window in panel
4 support rail system
5 roof system
6 communication cable
7 leaky line
8 transmitter, 8a transmitting antenna feed line
9 electromagnetic irradiation
10 receiver, 10a reception antenna
11 comparator, 11a comparator feed line

The invention claimed is:

1. A method for determining an interfering field strength in an aircraft and an impairment of an electric system in the aircraft comprising cables between an outer shell and a panelling of the aircraft fuselage for transmitting signals in the aircraft, the method comprising:
   either feeding a predetermined transmission signal in at least one leaky line between the outer shell and panelling of the fuselage and receiving with a receiver a reception signal that is irradiated by the at least one leaky line,
   or transmitting a predetermined transmission signal with a transmitter and extracting a reception signal from the leaky line and
comparing amplitudes of the transmission and the reception signals.

2. Method according to claim 1 wherein additionally amplitudes of detected data with and without the panelling are compared to each other.

3. Method according to claim 1, wherein the amplitude of the transmission signal and/or the reception signal is calibrated in V/m.

4. An apparatus for determining an interfering field strength in an aircraft and an impairment of an electric system in the aircraft comprising:
   at least one leaky line between an outer shell and a panelling of a fuselage,
   at least one transmitter for transmitting a predetermined transmission signal and
   at least one receiver for receiving an irradiation signal, wherein
      either the transmitter is coupled to the leaky line for feeding the predetermined transmission signal in the leaky line,
      or the receiver is coupled to the leaky line for extracting a reception signal from the leaky line and
   a comparator for comparing the amplitudes of the transmission and reception signals.

5. Apparatus according to claim 4, wherein the comparator is a two-port network analyzer.

6. Apparatus according to claim 4, wherein the antenna of the receiver comprises a leaky line.

7. Apparatus according to claim 4, wherein the receiver comprises a mobile antenna, the geometrical dimensions of which are small in comparison to the longitudinal dimension of the leaky line.

8. Apparatus according to claim 4, wherein an assemblage of leaky lines is disposed in the aircraft between the outer shell and panelling in parallel to the aircraft axis.

9. Apparatus according to claim 8, wherein the leaky lines are uniformly distributed over the circumference of the fuselage and pairs of adjacent leaky lines mutually have an identical distance from each other.

10. Apparatus according to claim 8, wherein transverse lines are disposed in addition to the assemblage of leaky lines in parallel to the aircraft axis so as to subdivide the fuselage into a grid of longitude and latitude coordinates.

11. Apparatus according to claim 8 wherein the individual leaky lines are each coupled to an individual transmitter or receiver.

* * * * *

UNITED STATES PATENT AND TRADEMARK OFFICE
CERTIFICATE OF CORRECTION

PATENT NO. : 7,808,251 B2  
APPLICATION NO. : 11/970496  
DATED : October 5, 2010  
INVENTOR(S) : Krueger et al.

Page 1 of 1

It is certified that error appears in the above-identified patent and that said Letters Patent is hereby corrected as shown below:

Tital page, Col. 2 (Abstract), delete "relates" and insert -- relate --, therefor.

Column 8, line 53, Claim 4, after "comparing" delete "the".

Signed and Sealed this
Twenty-second Day of February, 2011

David J. Kappos
*Director of the United States Patent and Trademark Office*